United States Patent
Cioffi et al.

(10) Patent No.: US 7,679,466 B1
(45) Date of Patent: Mar. 16, 2010

(54) COUNTER-BASED RESONATOR FREQUENCY COMPENSATION

(75) Inventors: Kenneth R. Cioffi, San Jose, CA (US); Michael Simoneau, Morgan Hill, CA (US); Didier Lacroix, Los Gatos, CA (US); Wan-Thai Hsu, Saline, MI (US)

(73) Assignee: Discera, Inc., San Jose, CA (US)

( * ) Notice: Subject to any disclaimer, the term of this patent is extended or adjusted under 35 U.S.C. 154(b) by 0 days.

(21) Appl. No.: 12/041,486

(22) Filed: Mar. 3, 2008

Related U.S. Application Data

(60) Provisional application No. 60/892,392, filed on Mar. 1, 2007.

(51) Int. Cl.
*H03B 5/32* (2006.01)

(52) U.S. Cl. ...................................... 331/158; 368/159

(58) Field of Classification Search ................. 331/158, 331/66, 176; 368/159
See application file for complete search history.

(56) References Cited

U.S. PATENT DOCUMENTS

| 4,282,595 | A |   | 8/1981 | Lowdenslager et al. |         |
|-----------|---|---|--------|---------------------|---------|
| 5,771,180 | A | * | 6/1998 | Culbert             | 702/130 |

* cited by examiner

*Primary Examiner*—Joseph Chang

(57) ABSTRACT

Disclosed herein is a timing device that includes a resonator device to generate a resonator output signal at a frequency offset from a desired frequency, a counter configured to generate an extraction signal in accordance with the frequency offset, and a timing signal generator configured to track time with a count based on the resonator output signal and modified by the extraction signal downward to reach the desired frequency.

11 Claims, 3 Drawing Sheets

COUNTER-BASED RESONATOR FREQUENCY COMPENSATION

CROSS-REFERENCE TO RELATED APPLICATION

This application claims the benefit of U.S. provisional application entitled "Temperature Compensation and Initial Accuracy Adjustment for Resonator-Based Real Time Clocks," filed Mar. 1, 2007, and having Ser. No. 60/892,392, the entire disclosure of which is hereby expressly incorporated by reference.

BACKGROUND OF THE DISCLOSURE

1. Field of the Disclosure

The disclosure relates generally to resonator-based devices and, more particularly, to resonator-based clocks and other timing signal applications.

2. Brief Description of Related Technology

Accuracy measured in parts per million (ppm) is often required to keep accurate time information for time-of-day and other real time clock applications. Real time clocks are used in a variety of contexts relying on accurate time information, such as watches, clocks, PCs, mobile phones, cameras, appliances, wireless communications devices, etc.

Conventional real time clock output signals are generated from the output of an accurate quartz crystal oscillator, which has been trimmed to have an accuracy within 10 ppm to the target frequency, often 32.768 kHz. The frequency variation over the operating temperatures of quartz crystal has a parabolic shape. This parabolic shape has provided temperature frequency variation to about 13 ppm over a temperature range of 0-50 degrees, but can vary substantially outside of that temperature range.

Recently, micro-mechanical or microelectromechanical (MEMS) resonators have shown promise as a replacement to quartz crystal oscillators. While MEMS devices have been shown to provide size and cost advantages as well as compatibility with standard silicon circuitry, prior attempts to trim the initial MEMS resonator frequency have often introduced complexities, thereby increasing manufacturing costs.

The resonant frequency of a MEMS resonator also varies with temperature. Without any compensation, the resonant frequency of a MEMS resonator typically varies with temperature to an extent greater than that of a quartz crystal. Unfortunately, attempts to control or prevent temperature-based variation in the resonant frequency have often involved modifications to the MEMS resonator design.

SUMMARY OF THE DISCLOSURE

In accordance with one aspect of the disclosure, a timing device includes a resonator device to generate a resonator output signal at a frequency offset from a desired frequency, a counter configured to generate an extraction signal in accordance with the frequency offset, and a timing signal generator configured to track time with a count based on the resonator output signal and modified by the extraction signal downward to reach the desired frequency.

In some cases, the counter includes an integer counter configured to generate a pulse at regular intervals at a frequency in accordance with the frequency offset. Alternatively, the counter includes a fractional counter configured to track of a fractional remainder between a number of pulses used to generate a pulse of the extraction signal and the frequency offset.

The timing device may also include a memory configured to store an initial frequency offset of the resonator device such that a representation of the frequency offset used to configure the counter is based on the initial frequency offset. Alternatively or additionally, the timing device also includes a temperature sensor configured to measure an operating temperature of the resonator device, and a calculator to generate a representation of the frequency offset based on the measured operating temperature. The counter may then be configured to generate the extraction signal based on the representation of the frequency offset. Alternatively or additionally, the timing device also includes a memory configured to store an aging rate for the resonator device, and a calculator to generate a representation of the frequency offset based on the aging rate. The counter may then be configured to generate the extraction signal based on the representation of the frequency offset.

In accordance with another aspect of the disclosure, a method is useful for generating a timing signal of a desired frequency. The method includes the steps of generating a resonator output signal at a frequency offset from the desired frequency, generating an extraction signal in accordance with the frequency offset, and generating the timing signal with a count based on the output signal and modified by the extraction signal downward to reach the desired frequency.

In some cases, the extraction signal generating step includes utilizing a counter to generate a pulse at regular intervals at a frequency in accordance with the frequency offset. Alternatively, the extraction signal generating step includes tracking a fractional remainder between a number of pulses used to generate a pulse of the extraction signal and the frequency offset.

The method may further include the step of determining a representation of the frequency offset based on an initial frequency offset of a resonator device configured to generate the resonator output signal, such that the extraction signal generating step includes utilizing the representation of the frequency offset to generate the extraction signal. Alternatively or additionally, the method further includes the steps of measuring an operating temperature of the resonator device, and determining a representation of the frequency offset based on the measured operating temperature, such that the extraction signal generating step includes utilizing the representation of the frequency offset to generate the extraction signal. Alternatively or additionally, the method further includes the step of determining a representation of the frequency offset based on an aging rate for the resonator output signal, such that the extraction signal generating step includes utilizing the representation of the frequency offset to generate the extraction signal.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1:
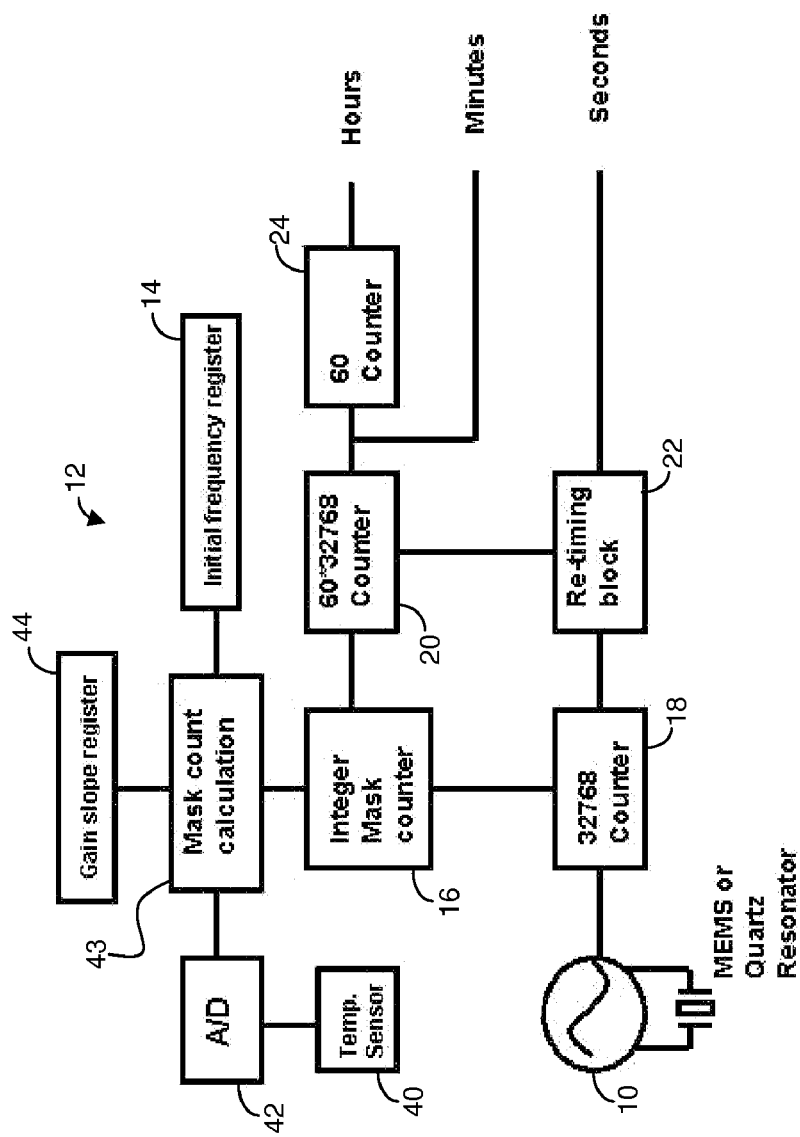
FIG. 1 is a block diagram of a real time clock system having an integer mask counter for initial frequency calibration and temperature compensation in accordance with an exemplary embodiment.

While the disclosed devices, systems and methods are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE DISCLOSURE

The disclosure generally relates to methods and systems for achieving initial frequency accuracy and temperature-compensated operation for resonator-based real time clocks and other timing signal applications. The disclosed methods and systems generally provide a technique or mechanism for electrically trimming the underlying resonator device to address an initial frequency offset and operating temperature variations without requiring any design modifications affecting the resonator device itself.

In some cases involving MEMS resonator devices, the disclosed systems and methods can correct uncompensated resonators to an initial accuracy of 1 ppm as well as correct over temperature ranges of better than 100 degrees to 1 ppm or less. Although the disclosed methods and systems are particularly well suited for use with MEMS resonators due to their highly linear frequency vs. temperature characteristic, the disclosed systems and methods may also be used to correct quartz-based resonators. If the aging of the resonator is known, this method also can be used for correcting the aging of the resonator.

In a real time clock (RTC) application, it is generally useful to maintain a small overall time error on a long-term basis. While some error may occur over short term intervals, the clock application is successfully implemented as long as the overall accuracy is maintained at the time intervals of interest in the application. For example, an application may not need the output signal to have high accuracy or evenly distributed clock pulses over each second of operation, but still benefit from maintaining a consistent and accurate total number of pulses per minute.

Generally speaking, the disclosed methods and systems utilize this aspect of RTC and other timing signal applications to avoid changing the actual frequency of the resonator device for the purpose of trimming and other frequency adjustments. In accordance with this aspect of the disclosure, the resonator frequency is set at a satisfactorily high level, such that given manufacturing, temperature and other variations in the frequency, the frequency will remain higher than the desired frequency. This frequency cushion may then be relied upon in an application for which a lower clock frequency is utilized. Pulses from an oscillating waveform generated by the disclosed systems and methods are then subtracted or extracted (i.e., removed), such that the total pulse count, within a given time period, is accurate.

In one exemplary application of an embodiment of the disclosed methods and systems, the accuracy at the second level reaches approximately 30 ppm, while a long term accuracy of less than 1 ppm at the minute level and above is maintained.

In some cases, two corrections of the resonator frequency are implemented to achieve a desired accuracy level, namely an initial accuracy adjustment (or calibration) and a temperature variation compensation. In other cases, the disclosed techniques may be applied to implement only one of the two corrections.

The disclosed techniques may be implemented in connection with frequency compensation for a MEMS resonator-based device or system. The initial frequency accuracy of an untrimmed MEMS based resonator is on the order of a few percent. This variation may be due to lithographic and semiconductor process variations. Implementation of an initial calibration procedure in accordance with one aspect of the disclosure can trim this down to an accuracy of less than 1 ppm.

With reference now to the drawing figures, FIG. 1 depicts an embodiment of the disclosed techniques in which the frequency of a MEMS, quartz crystal or other resonator device 10 (e.g., an oscillator) is adjusted or corrected by a circuit indicated generally at 12. The initial frequency of the resonator device 10 is measured and the frequency is recorded or stored in an initial frequency register 14 or any other memory. A desired frequency value (e.g., 32768 Hz) is subtracted from the recorded value and the result is used to program an integer mask counter 16 with a representation of the offset from the desired frequency value. For example, if the initial frequency of the device 10 is 33.0 kHz, the offset used to program the integer mask counter 16 is 33.0-32.768 kHz, or 232 Hz. The integer mask counter 16, which may take the form of any programmable counter, is then configured to count at a frequency of 232 Hz.

The value of 32.768 kHz may be convenient because it is a common RTC frequency and is an exact power of 2 and therefore convenient to implement. However, practice of the disclosed methods and systems is not limited to this frequency value, but rather may utilize any desired frequency value smaller than the actual resonator frequency. That is, practice of the disclosed methods and systems relies on the actual device frequency being higher than the desired frequency to enable a downward adjustment thereto via pulse or count extraction, as described below.

The mask counter 16 generates mask counts when the difference value is reached. In the example above, the counter 16 provides an increment or pulse once every $1/232$ seconds. These counts from the mask counter 16 are used to mask (or otherwise extract) counts of the resonator (or oscillator) device 10 that are provided into a base timing signal generator or counter 18. In this exemplary case, the base timing signal generator 18 is a 32768 counter configured to provide a pulse every second. In other words, the output of the counter 18 is a pulse generated at 32768 counts, which corresponds with one second within 1 clock cycle of the input clock.

A similar procedure is used to track time at the minutes level using a counter 20 configured at 60*32768. The output pulse of the counter 20 is generated at one minute within one clock cycle of the initial clock, which presents an accuracy of 1/(60*32768) or less than 1 ppm. A synchronization (or retiming) block 22 may be used to ensure that the seconds level output aligns exactly with the minutes level output at the 60th seconds pulse. A further timing signal output may be generated by yet another counter 24 configured for the hours level.

Figure 2:
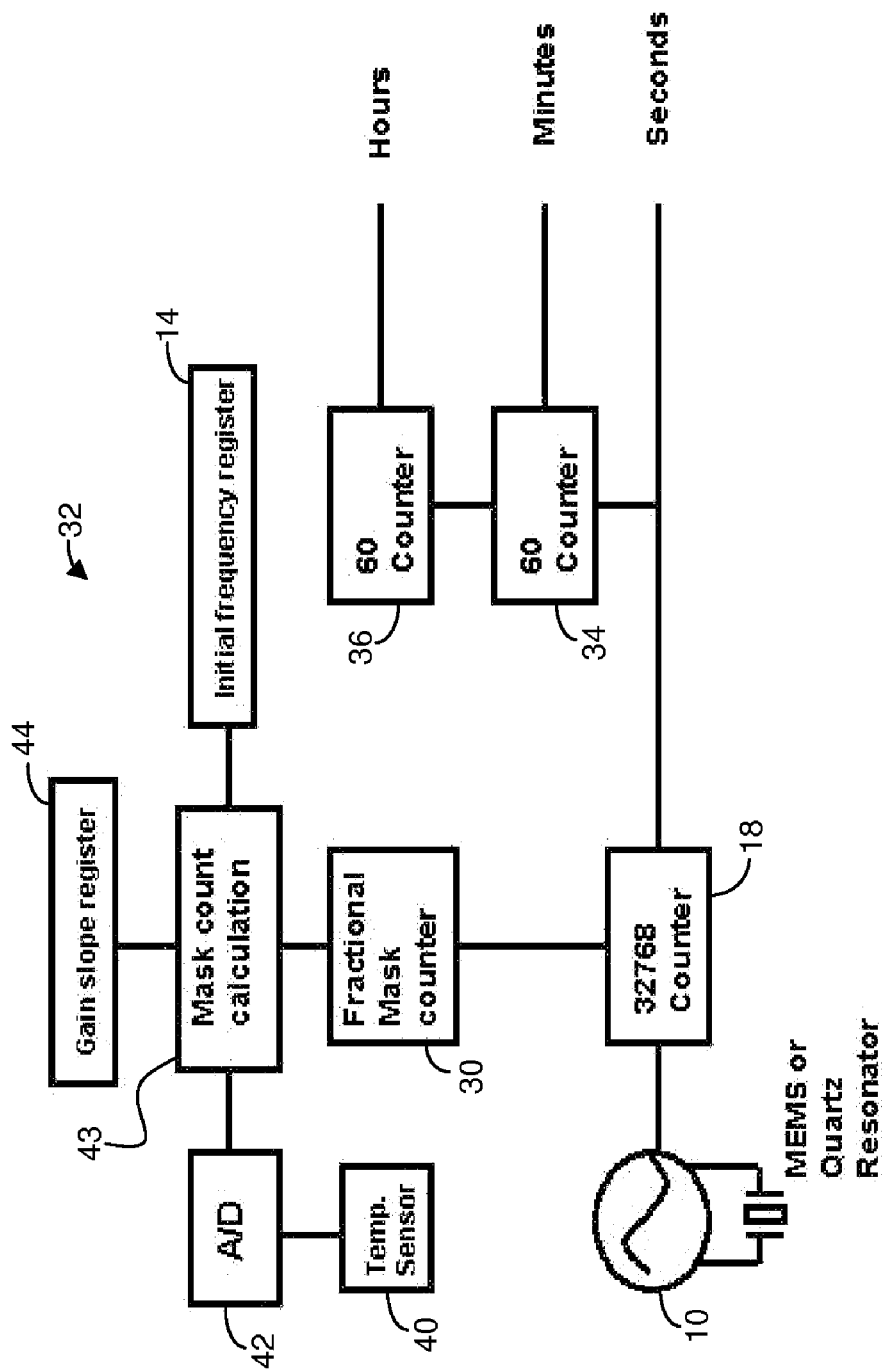
FIG. 2 is a block diagram of a real time clock system having a fractional mask counter for initial frequency calibration and temperature compensation in accordance with another exemplary embodiment; and, FIG. 3 is a plot of input, output and intermediate signal waveforms associated with a simulation of the operation of the system of FIG. 2 in accordance with another aspect of the disclosure.

In the exemplary embodiment shown in FIG. 2, where elements in common are identified with like reference numerals, a fractional mask counter 30 of a timing circuit indicated generally at 32 keeps track of the fractional remainder between the number of pulses used to generate the output mask pulse and the actual difference. When the remainder exceeds one, an additional count is added into the time before the next mask pulse is generated. Thus, the mask pulses do not occur at regular intervals (as in the previous embodiment), but rather are adjusted to reflect an exact difference. Therefore, the accuracy is always within 1 count regardless of the length of the elapsed time. The accuracy is limited only by the number of digits used to keep track of the fractional remainder.

Figure 3:
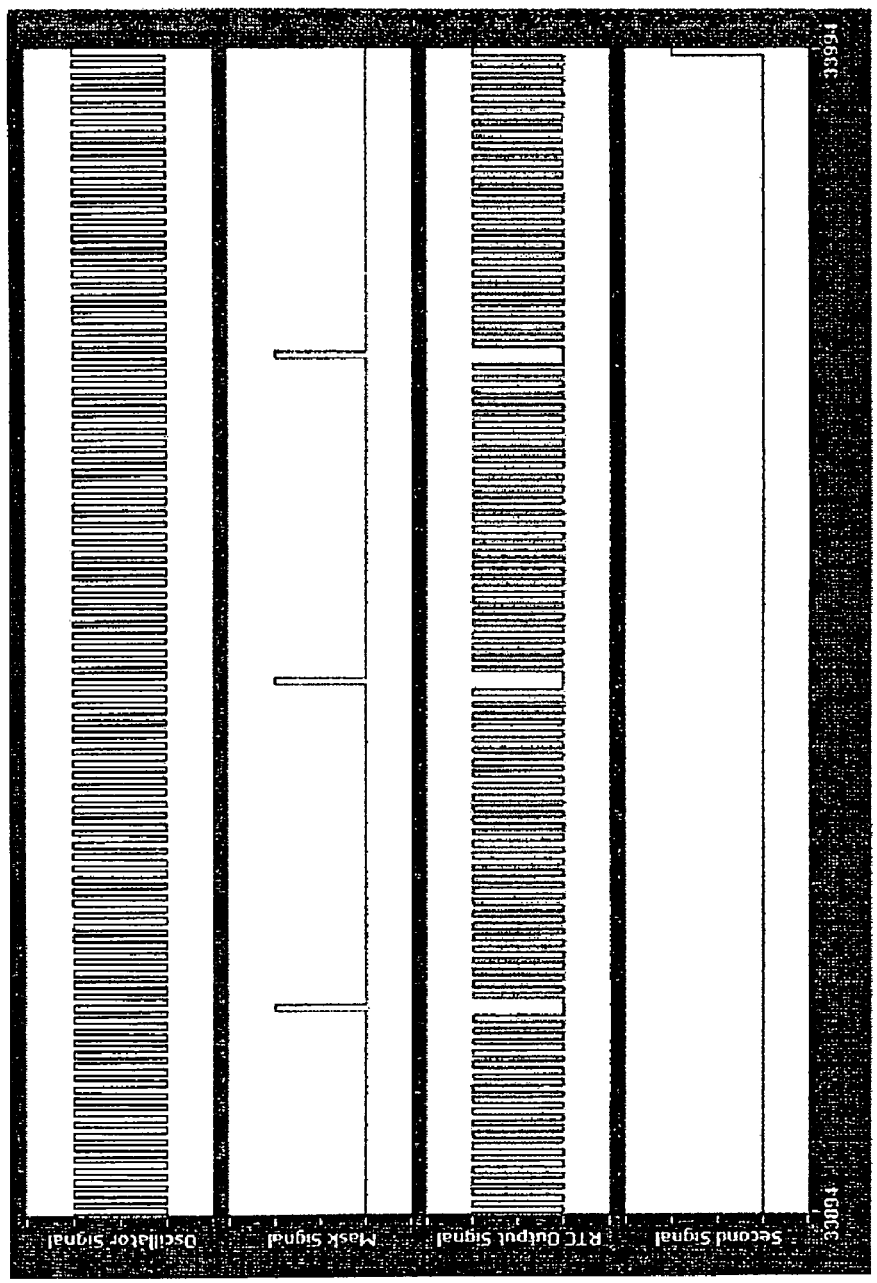

The timing circuit 32 of FIG. 2 may also be configured for operation with the resonator device 10 having a frequency above a desired frequency of 32.768 kHz. As a result, the 32768 counter 18 may be used to generate a seconds level output, which is then fed to a 60 counter 34 for the minutes level, which in turn drives a 60 counter 36 for the hours level. A simulation showing the initial frequency output from the resonator oscillator, the mask counter output, and the input to the 32768 counter 18 is shown in FIG. 3.

The counters and other components described in connection with the exemplary embodiments shown in FIGS. 1 and 2 may be implemented with commercially available, off-the-shelf components that utilize, for instance, standard CMOS technology. In some cases, the counters may implement the logic in a low-power manner. Alternatively or additionally, the functionality of any number of the counters and other components of the exemplary embodiments may be implemented by one or more application specific integrated circuits (ASIC) chips.

In accordance with another aspect of the disclosure, both of the above-described embodiments may be additionally (or alternatively) configured to compensate for temperature variation in the output frequency of the resonator device 10. The temperature variation of the resonator may be compensated in a similar manner in connection with the above-described embodiments. In each case, a temperature sensor 40 monitors the ambient or die temperature for the resonator device 10 and its output is converted to a digital signal by an analog-to-digital converter 42.

The correction technique for temperature may then be implemented in accordance with the following expression:

$$F_{osc}=F_{cal}+F_{tc}(T-T_{cal})$$

where
$F_{cal}$: Calibration Frequency at $T_{cal}$
$T_{cal}$: Calibration Temperature
$F_{tc}$: Frequency Compensation (slope)
T: Current Measured Temperature The value of $F_{osc}$ is now determined by a calculator 43 as the new oscillator frequency, which, in turn, is used to calculate the mask pulses as described above. To those ends, the calculator 43 receives data input from the initial frequency register 14 and the converter 42. The value $F_{tc}$, the gain slope for the temperature characteristic, may be stored in a register 44 or in any other memory. In some cases, the gain slope is derived from two temperature points at calibration and stored in the register 44.

The accuracy of this method is limited by the accuracy of the linearity in the temperature sensor, AD, and resonator. A piecewise linear solution may be used to improve the accuracy. With this approach, an additional temperature data point is determined for each added piece in the piecewise linear approximation. Alternatively, a nonlinear function may be used to represent the temperature function in Equation 1. A nonlinear function may be well suited for temperature compensation of a quartz crystal resonator device (and other resonators exhibiting nonlinear characteristics) in the disclosed manner.

The embodiments of FIGS. 1 and 2 may be utilized to correct for aging-related inaccuracies in RTC and other timing applications. In each case, one of the memories 14, 44 (or some other memory) may store an indication of an aging rate predetermined for the resonator device 10. Generally speaking, aging can cause changes that result in an increase or decrease in the operating frequency, depending upon the type of resonator device. The calculator 43 is then programmed to calculate the mask count in accordance with the predetermined aging rate. For example, the calculation may result in the addition or deduction of one or more mask pulses per aging period.

Although the disclosed techniques has been described specifically for generating real time clock functionality, the techniques may be applied to non-real time clock applications where an accurate timing signal needs to be generated from a non-accurate clock.

Embodiments of the disclosed system and method may be implemented in hardware or software, or a combination of both. Some embodiments may be implemented as computer programs executing on programmable systems having at least one processor, and a data storage system (including volatile and non-volatile memory and/or storage elements). Program code may be applied to data to perform the functions described herein and generate output information. The output information may be applied to one or more output devices, in known fashion. For purposes of this application, a processor includes any system that has a processor, such as, for example, a digital signal processor (DSP), a microcontroller, an application specific integrated circuit (ASIC), or a microprocessor.

The programs may be implemented in a high level procedural or object oriented programming language to communicate with the processor. The programs may also be implemented in assembly or machine language, if desired. In fact, practice of the disclosed system and method is not limited to any particular programming language. In any case, the language may be a compiled or interpreted language.

The programs may be stored on a storage media or device (e.g., floppy disk drive, read only memory (ROM), CD-ROM device, flash memory device, digital versatile disk (DVD), or other storage device) readable by a general or special purpose programmable processor, for configuring and operating the processor when the storage media or device is read by the processor to perform the procedures described herein. Embodiments of the disclosed system and method may also be considered to be implemented as a machine-readable storage medium, configured for use with a processor, where the storage medium so configured causes the processor to operate in a specific and predefined manner to perform the functions described herein.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A timing device, comprising:
   a resonator device to generate a resonator output signal at a frequency above a desired frequency;
   a calculator to determine a corrected frequency offset to compensate for an initial frequency offset of the resonator device and to adjust for frequency variation during operation of the resonator device;

a counter configured to generate an extraction signal in accordance with the corrected frequency offset; and a timing signal generator configured to track time with a count based on the resonator output signal and modified by the extraction signal downward to reach the desired frequency.

2. The timing device of claim 1, wherein the counter comprises an integer counter configured to generate a pulse at regular intervals at a frequency in accordance with the corrected frequency offset.

3. The timing device of claim 1, wherein the counter comprises a fractional counter configured to track a fractional remainder between a number of pulses used to generate a pulse of the extraction signal and the corrected frequency offset.

4. The timing device of claim 1, further comprising a memory configured to store the initial frequency offset of the resonator device.

5. The timing device of claim 1, further comprising a temperature sensor configured to measure an operating temperature of the resonator device and coupled to the calculator such that the corrected frequency offset is based on the measured operating temperature.

6. The timing device of claim 1, further comprising a memory configured to store an aging rate for the resonator device and coupled to the calculator such that the corrected frequency offset is based on the aging rate.

7. A method of generating a timing signal of a desired frequency, the method comprising the steps of:

generating a resonator output signal from a resonator device at a frequency above the desired frequency;

determining a corrected frequency offset to compensate for an initial frequency offset of the resonator device and to adjust for frequency variation during operation of the resonator device;

generating an extraction signal in accordance with the corrected frequency offset;

generating the timing signal with a count based on the output signal and modified by the extraction signal downward to reach the desired frequency.

8. The method of claim 7, wherein the extraction signal generating step comprises utilizing a counter to generate a pulse at regular intervals at a frequency in accordance with the corrected frequency offset.

9. The method of claim 7, wherein the extraction signal generating step comprises tracking a fractional remainder between a number of pulses used to generate a pulse of the extraction signal and the corrected frequency offset.

10. The method of claim 7, further comprising the steps of measuring an operating temperature of the resonator device, and determining a representation of the frequency variation from the measured operating temperature such that the corrected frequency offset is based on the measured operating temperature.

11. The method of claim 7, further comprising the step of determining a representation of the frequency variation based on an aging rate for the resonator output signal.

* * * * *